(12) United States Patent
Nikitin et al.

(10) Patent No.: US 12,283,563 B2
(45) Date of Patent: Apr. 22, 2025

(54) SEMICONDUCTOR MODULE WITH BOND WIRE LOOP EXPOSED FROM A MOLDED BODY AND METHOD FOR FABRICATING THE SAME

(71) Applicant: Infineon Technologies Austria AG, Villach (AT)

(72) Inventors: Ivan Nikitin, Regensburg (DE); Peter Luniewski, Poing (DE)

(73) Assignee: Infineon Technologies Austria AG, Villach (AT)

( * ) Notice: Subject to any disclaimer, the term of this patent is extended or adjusted under 35 U.S.C. 154(b) by 392 days.

(21) Appl. No.: 17/732,930

(22) Filed: Apr. 29, 2022

(65) Prior Publication Data

US 2022/0352114 A1 Nov. 3, 2022

(30) Foreign Application Priority Data

Apr. 30, 2021 (EP) .................................... 21171548

(51) Int. Cl.
*H01L 23/00* (2006.01)
*H01L 23/31* (2006.01)

(52) U.S. Cl.
CPC .......... *H01L 24/49* (2013.01); *H01L 23/3121* (2013.01); *H01L 24/43* (2013.01); *H01L 2224/43* (2013.01); *H01L 2224/48091* (2013.01); *H01L 2224/48227* (2013.01); *H01L 2224/49176* (2013.01); *H01L 2924/182* (2013.01)

(58) Field of Classification Search
None
See application file for complete search history.

(56) References Cited

U.S. PATENT DOCUMENTS

| 6,268,662 | B1 * | 7/2001 | Test ........................ H01L 24/11 257/784 |
| 2006/0205280 | A1 | 9/2006 | Nishizawa et al. |
| 2007/0222087 | A1 | 9/2007 | Lee et al. |
| 2010/0314748 | A1 | 12/2010 | Hsu et al. |
| 2017/0125395 | A1 | 5/2017 | Hohlfeld et al. |

FOREIGN PATENT DOCUMENTS

| CN | 107564889 A | 1/2018 |
| WO | 2016196189 A1 | 12/2016 |
| WO | 2020235056 A1 | 11/2020 |

* cited by examiner

*Primary Examiner* — Robert K Carpenter
(74) *Attorney, Agent, or Firm* — Murphy, Bilak & Homiller, PLLC

(57) ABSTRACT

A semiconductor module includes a substrate, a semiconductor die arranged on the substrate, at least one first bond wire loop, wherein both ends of the at least one first bond wire loop are arranged on and coupled to a first electrode of the semiconductor die, and a molded body encapsulating the semiconductor die, wherein a top portion of the at least one first bond wire loop is exposed from a first side of the molded body.

14 Claims, 5 Drawing Sheets

//www.w3.org/1999/xlink" xmlns="http://www.w3.org/2000/svg"
SEMICONDUCTOR MODULE WITH BOND WIRE LOOP EXPOSED FROM A MOLDED BODY AND METHOD FOR FABRICATING THE SAME

TECHNICAL FIELD

This disclosure relates in general to semiconductor modules, in particular to semiconductor modules wherein a bond wire loop is exposed from a molded body as well as to methods for fabricating the same.

BACKGROUND

Semiconductor module fabrication comprises various consecutive process steps, e.g. attaching a die to a carrier, fabricating electrical interconnects, encapsulation, etc. It may be desirable to perform an electrical functionality test on semiconductor modules in fabrication prior to a particular step of the fabrication process. For example, the fabrication process may comprise a lamination step, wherein a laminate is arranged over a semiconductor die. It may be more cost efficient to perform the electrical functionality test prior to the lamination step since in the case the module has an electrical defect, the whole laminated assembly would be a reject.

Furthermore, if the fabrication of the electrical interconnects comprises a grinding process or a drilling process, there may be a risk that the semiconductor die is damaged by the grinding or drilling equipment due to height tolerances.

Improved semiconductor modules and improved methods for fabricating semiconductor modules may help with solving these and other problems. The problem on which the invention is based is solved by the features of the independent claims. Further advantageous examples are described in the dependent claims.

SUMMARY

Various aspects pertain to a semiconductor module comprising a substrate, a semiconductor die arranged on the substrate, at least one first bond wire loop, wherein both ends of the first bond wire loop are arranged on and coupled to a first electrode of the semiconductor die, and a molded body encapsulating the semiconductor die, wherein a top portion of the at least one first bond wire loop is exposed from a first side of the molded body.

Various aspects pertain to a method for fabricating a semiconductor module, the method comprising: providing a substrate, arranging a semiconductor die on the substrate, fabricating at least one first bond wire loop on the semiconductor die such that both ends of the first bond wire loop are arranged on and coupled to a first electrode of the semiconductor die, and encapsulating the semiconductor die in a molded body such that a top portion of the at least one first bond wire loop is exposed from a first side of the molded body.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

In FIG. 2B the molded body, the laminate and the metallization are omitted.

DETAILED DESCRIPTION

In the following detailed description, directional terminology, such as "top", "bottom", "left", "right", "upper", "lower" etc., may be used with reference to the orientation of the Figure(s) being described. Because components of the disclosure can be positioned in a number of different orientations, the directional terminology is used for purposes of illustration only.

Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The semiconductor modules described below may e.g. comprise semiconductor dies comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor die, opposite to the first main face.

The semiconductor modules described below may include one or more semiconductor dies. By way of example, one or more power semiconductor power dies may be included. Further, one or more logic integrated circuits may be included in the modules.

An efficient semiconductor module may for example reduce material consumption, ohmic losses, chemical waste etc. and may thus enable energy and/or resource savings. Improved semiconductor modules and improved methods for fabricating semiconductor modules, as specified in this description, may thus at least indirectly contribute to green technology solutions, i.e. climate-friendly solutions providing a mitigation of energy and/or resource use.

Figure 1:
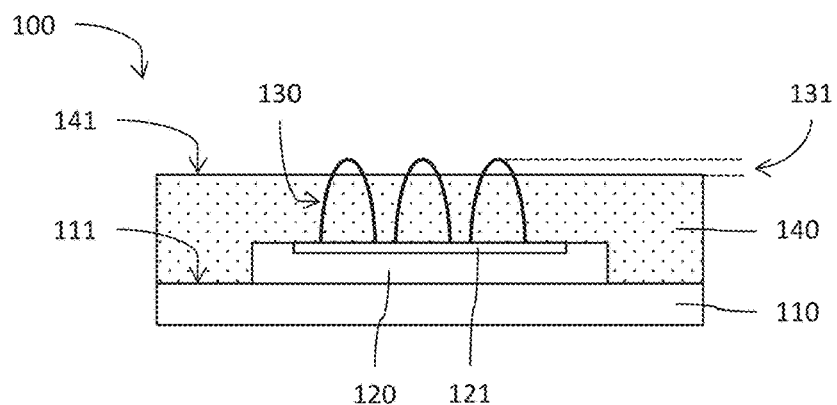
FIG. 1 shows a sectional view of a semiconductor module, wherein a bond wire loop is exposed from a molded body.

FIG. 1 shows a semiconductor module 100 which comprises a substrate 110, a semiconductor die 120, at least one first bond wire loop 130 and a molded body 140.

The semiconductor die 120 is arranged on the substrate 110, for example such that a lower side (e.g. a backside) of the semiconductor die 120 faces a first side 111 of the substrate 110. The at least one first bond wire loop 130 is configured such that both ends of the first bond wire loop 130 are arranged on and coupled to a first electrode 121 of the semiconductor die 120. Furthermore, the molded body 140 encapsulates the semiconductor die 120 such that a top portion 131 of the at least one first bond wire loop 130 is exposed from a first side 141 of the molded body 140.

The substrate 110 may be any suitable type of substrate, for example a substrate of the type direct copper bond (DCB), direct aluminum bond (DAB), active metal brazing (AMB), insulated metal substrate (IMS), printed circuit board (PCB), leadframe, etc. Furthermore, the substrate 110 may be a passive electric device, e.g. a capacitance, an inductor or a resistor, or it may be another semiconductor die.

The semiconductor die 120 may be any suitable type of semiconductor die, for example a power semiconductor die. The semiconductor module 100 may comprise a single semiconductor die 120 or it may comprise several semiconductor dies 120. In the latter case, the semiconductor dies 120 may be all identical or they may be different types of semiconductor dies. According to an example, the semiconductor die 120 comprises an electrode, e.g. a power electrode, on its lower side, wherein the electrode is electrically coupled to the substrate 110. The electrode on the lower side may for example be coupled to the substrate 110 by a solder joint.

The first electrode 121 may for example be a power electrode, e.g. a source, drain, emitter, or collector electrode, of the semiconductor die 120. However, it may also be a control electrode like a gate electrode or a sensing electrode. The first electrode 121 may comprise a layer stack of one or more metal layers or metal alloy layers. The at least one first bond wire loop 130 may be coupled to an outermost layer of the layer stack. The at least one first bond wire loop 130 may e.g. be soldered to the first electrode 121.

According to an example, layer stack of the first electrode 121 comprises a Ti layer arranged on the semiconductor material of the semiconductor die 120 and NiV layer arranged on the Ti layer. Any suitable type of solder material, e.g. a solder comprising Sn, may be used to couple the first bond wire loop 130 to the first electrode 121.

According to an example, one end of the at least one first bond wire loop 130 is ball bonded to the first electrode 121 and the other end of the at least one first bond wire loop 130 is wedge bonded to the first electrode 121. According to another example, both ends of the at least one first bond wire loop 130 are wedge bonded to the first electrode 121. Using wedge bonds only may allow for the using thicker bond wires to form the bond wire loops, e.g. bond wires with a diameter of 400 µm. Using ball bonds and wedge bonds may require using comparatively thinner bond wires, e.g. bond wires with a diameter of 75 µm.

The semiconductor module 100 may comprise any suitable number of first bond wire loops 130. All of the first bond wire loops 130 may be coupled to the first electrode 121 (in particular, both ends of each of the first bond wire loops 130 may be coupled to the first electrode 121). The first bond wire loops 130 may for example be arranged in an array on the first electrode 121.

According to an example, the semiconductor module 100 may comprise one or more further bond wire loops which may for example be coupled to one or more further electrodes of the semiconductor die 120 or to the substrate 110 (in particular, both ends of a respective further bond wire loop may be coupled to a respective further electrode or to the substrate).

The first bond wire loop 130 may for example have a height measured between the first electrode 121 and the top of the top portion 131 in the range of 50 µm to 500 µm, in particular in the range of 100 µm to 300 µm. The first bond wire loop 130 may for example have a spread between the two ends of the first bond wire loop 130 measured in a plane comprising the first electrode 121 in the range of 300 µm to 3 mm, in particular in the range of 500 µm to 1.5 mm. Adjacent first bond wire loops 130 may for example be spaced apart at a distance of 100 µm to 500 µm, for example about 200 µm.

In the case that the semiconductor module 100 comprises more than one bond wire loop, the tops of all bond wire loops may essentially be arranged in the same plane above the first side 141 of the molded body 140. The tops may e.g. be aligned in the same plane with an accuracy of +/−50 µm or better. In particular, the bond wire loops may help with compensating for any fabrication tolerances of e.g. the height of the substrate 110 or tolerances in the height of a solder joint coupling the semiconductor die 120 to the substrate 110.

The at least one first bond wire loop 130 may for example comprise a bond wire with a thickness in the range of 75 µm to 400 µm. The bond wire may e.g. be a Cu wire. The at least one first bond wire loop 130 may be configured to electrically connect the first electrode 121 to the outside of the molded body 140. The at least one first bond wire loop 130 may e.g. be configured to be operated at voltages of 750V or more, or 1200V or more.

The semiconductor module 100 may for example be configured to be operable at temperatures of up to 175° C. for more than 1000 h and it may be configured to be operable at temperatures of up to 200° C. for at least several hours.

The molded body 140 may comprise any suitable dielectric mold material, in particular mold material with high temperature stability and/or good dielectric properties. According to an example, the molded body 140 may comprise filler particles, for example filler particles comprising or consisting of silicon oxide or ceramics. The filler particles may be configured to improve the thermal and/or dielectric properties of the molded body 140. The filler particle content of the molded body 140 may e.g. be 70% or more and it may e.g. be as high as 95%. The filler particles may e.g. comprise or consist of silicon oxide or a ceramic.

The molded body 140 may essentially encapsulate the semiconductor die 120 on all sides which do not face the substrate 110. The molded body 140 may be solely arranged on the first side 111 of the substrate 110, as shown in FIG. 1. However, it is also possible that the molded body at least partially covers further sides of the substrate 110. A thickness of the molded body 140 above the upper side of the semiconductor die 120 may for example be 50 µm or more, or 100 µm or more, or 200 µm or more, or 300 µm or more. The molded body 140 may for example be fabricated using a compression molding process or a transfer molding process.

Figure 2A:
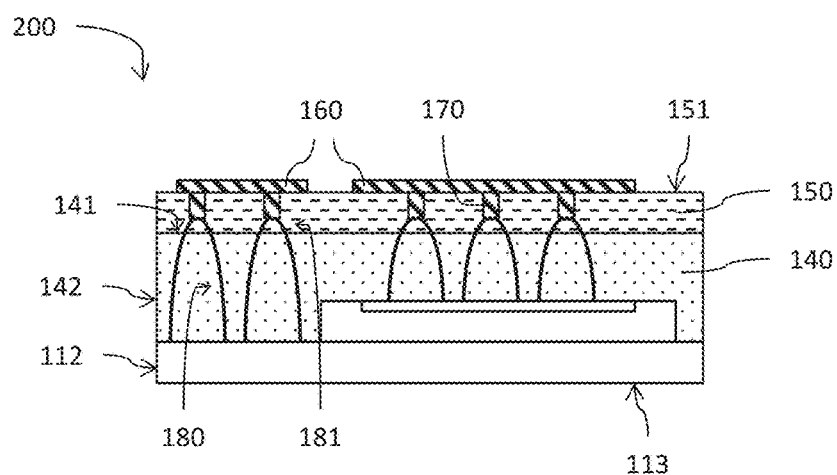
FIGS. 2A and 2B show a sectional view (FIG. 2A) and a perspective view (FIG. 2B) of a further semiconductor module, wherein a laminate is arranged over the molded body and the exposed bond wire loops.
Figure 2B:
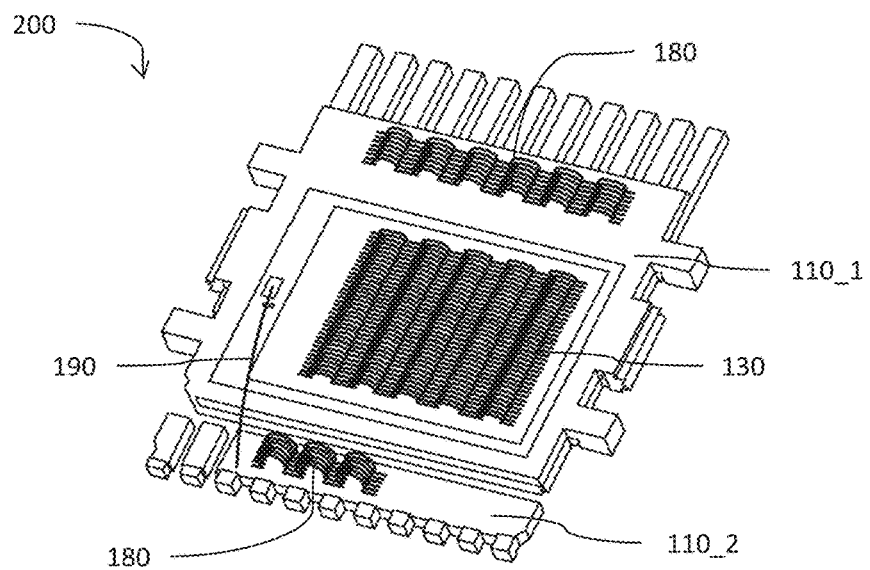

FIGS. 2A and 2B show a further semiconductor module 200 which may be similar to or identical with the semiconductor module 100, except for the differences described in the following. FIG. 2A shows a sectional view and FIG. 2B shows a perspective view.

The semiconductor module 200 comprises all components described with respect to the semiconductor module 100 and it additionally comprises a laminate 150 and a metallization layer 160. The laminate 150 at least partially encapsulates the molded body 140. The metallization layer 160 is arranged on a first side 151 of the laminate 150 and it is coupled to the top portion 131 of the at least one first bond wire loop 130 by at least one via 170 extending through the laminate 150. The metallization layer 160 may be a structured layer comprising contact pads and conductive tracks. In the perspective view of FIG. 2B the molded body 140, the laminate 150, the metallization layer 160 and the vias 170 are omitted.

According to an example, the laminate 150 is part of a printed circuit board configured for having one or more electronic components arranged on and coupled to the metallization layer 160.

The laminate 150 may cover only the first side 141 of the molded body 140, as shown in the example of FIG. 2. However, it is also possible that the laminate furthermore covers the lateral sides 142 of the molded body 140 and possibly also the lateral sides 112 of the substrate 110. Furthermore, the laminate 150 may also cover the second side 113 of the substrate 110.

The laminate 150 may for example comprise or consist of an epoxy resin. The laminate 150 may have a different material composition (a different dielectric material and/or a different filler material) than the molded body 140. The laminate 150 may comprise filler material in the form of a woven fabric, whereas the filler particles of the molded body 140 may essentially be individual spherical particles. A relative amount of filler material in the laminate 150 may be smaller, in particular considerably smaller, than a relative amount of filler particles in the molded body 140.

As shown in FIG. 2A, the laminate 150 may encapsulate the top portion 131 of the at least one first bond wire loop 130 such that the top portion 131 is not exposed to the outside. The one or more vias 170 may extend through the laminate 150 such that they contact the top portion 131. The vias 170 may essentially be configured to bridge over the remaining distance between the top portion 131 and the metallization layer 170 in the laminate 150. The vias 170 in particular do not have to extend into the molded body 140 because the top portion 131 of the at least one first bond wire loop is exposed from the molded body 140.

According to an example, the semiconductor module 200 further comprises at least one second bond wire loop 180 which is arranged on and coupled to the substrate 110. In particular, both ends of the at least one second bond wire loop 180 may be coupled to the first side 111 of the substrate 110. Similar to the first bond wire loop 130, a top portion 181 of the second bond wire loop 180 is exposed from the first side 141 of the molded body 140.

The at least one second bond wire loop 180 may for example be electrically coupled to an electrode on the lower side of the semiconductor die 120 via the substrate 110. The at least one second bond wire loop 180 may be coupled to the metallization layer 160 by one or more of the vias 170.

The at least one second bond wire loop 180 may essentially be identical to the at least one first bond wire loop 130, except that the at least one second bond wire loop may have a greater height, because it has to bridge the thickness of the semiconductor die 120.

According to an example, e.g. in the case that the substrate is a leadframe, the substrate 110 may comprise several distinct parts, e.g. a first substrate part 110_1 and a second substrate part 1102 (compare FIG. 2B). In this case, at least one second bond wire loop 180 may be arranged on a single one of the substrate parts 1101, 110_2 or at least one second bond wire loop 180 may be arranged on each one of the substrate parts 110_1, 110_2. The substrate parts 110_1, 110_2 may be electrically coupled to each other by an electrical connector 190, e.g. a bond wire.

According to an example, the semiconductor module 100 or 200 comprises two semiconductor dies 120 and at least one third bond wire loop. The at least one third bond wire loop may be identical to the first bond wire loop 130, except that its first end is coupled to an electrode on the first semiconductor die 120 and its second end is coupled to an electrode on the second semiconductor die 120. In particular, the ends of the at least one third bond wire loop may be arranged on the respective electrode or the third bond wire loop may be indirectly electrically coupled to the respective electrode, e.g. via a substrate part.

Figure 3A:
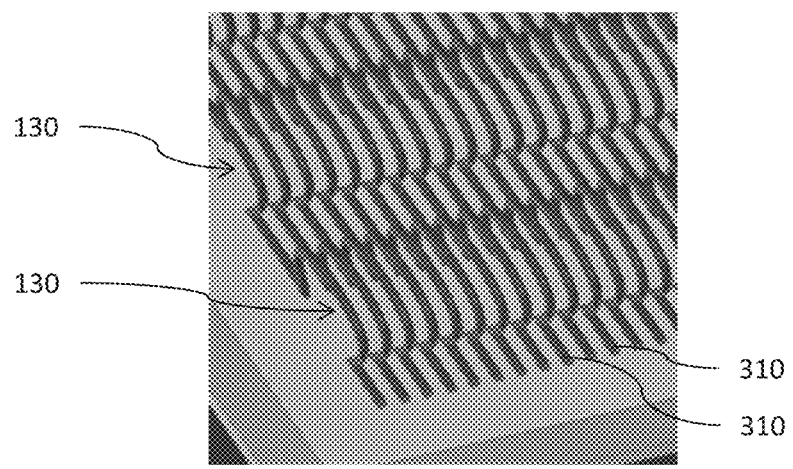
FIGS. 3A and 3B each show an array of bond wire loops according to two different examples.
Figure 3B:
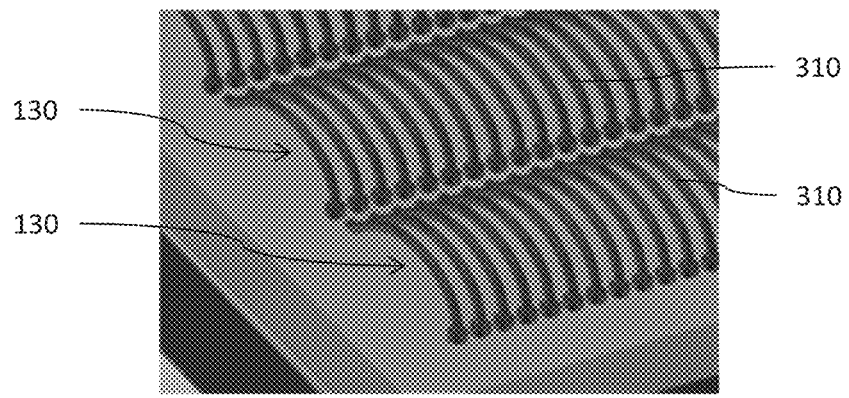

FIGS. 3A and 3B show perspective views of an array of first bond wire loops 130 according to two different examples.

In the example shown in FIG. 3A, both ends of the first bond wire loops 130 are wedge bonded to the semiconductor die 120. This also means that consecutive first bond wire loops 130 of a row of the array may be part of the same contiguous bond wire 310. In other words, each row of the array may comprise a single contiguous bond wire 310.

In the example shown in FIG. 3B, one end of each first bond wire loop 130 is wedge bonded and the other end is ball bonded to the semiconductor die 120. In other words, each first bond wire loop 130 comprises a distinct bond wire 310.

According to an example, the second bond wire loops 180 shown in FIG. 2 may be configured similar to the array shown in FIG. 3A or similar to the array shown in FIG. 3B.

With respect to FIGS. 4A to 4G a semiconductor module 400 is shown in various stages of fabrication, according to an exemplary method for fabricating semiconductor modules. The semiconductor module 400 may be similar to or identical with the semiconductor module 100 or 200.

Figure 4A:
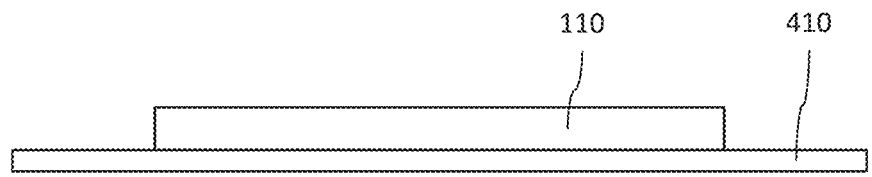
FIGS. 4A to 4G show sectional views of a further semiconductor module in various stages of fabrication, according to an exemplary method for fabricating semiconductor modules.

As shown in FIG. 4A, the substrate 110 is provided. This may comprise arranging the substrate 110 on a temporary carrier 410, for example a tape.

Figure 4B:
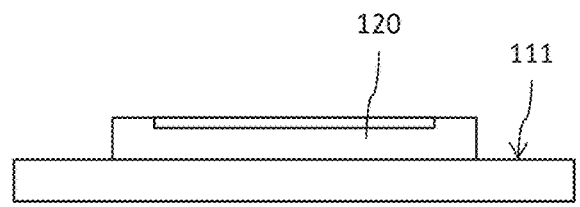

As shown in FIG. 4B, the semiconductor die 120 is arranged on the substrate 110. This may comprise soldering or gluing the lower side of the semiconductor die 120 to the first side 111 of the substrate 110. The semiconductor die 120 may or may not be electrically coupled to the substrate 110.

Figure 4C:
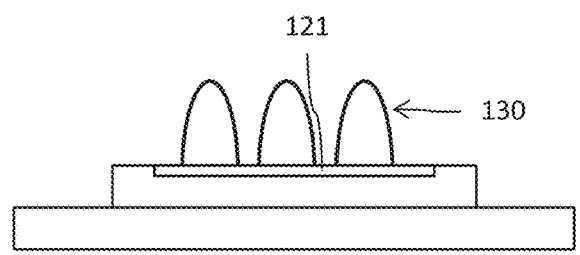

As shown in FIG. 4C, at least one first bond wire loop 130 is fabricated on the semiconductor die 120 such that both ends of the first bond wire loop 130 are arranged on and coupled to the first electrode 121. Fabricating the bond wire loop(s) 130 may for example be done using a conventional wire bonding equipment. According to an example, an array of first bond wire loops 130 as e.g. shown in FIG. 3A or 3B is bonded to the first electrode 121.

According to an example, at least one second bond wire loop 180 is fabricated on the substrate 110. The second bond wire loop(s) 180 may be fabricated in the same bonding process as the first bond wire loop(s) 130.

Figure 4D:
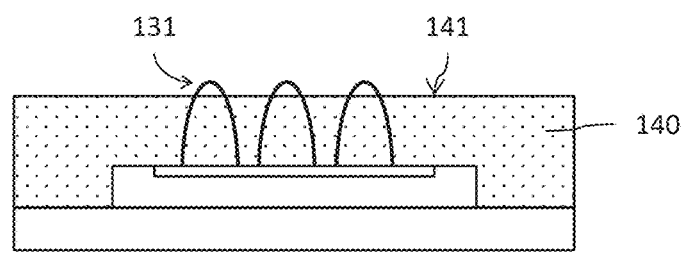

As shown in FIG. 4D, the semiconductor die 120 is encapsulated in the molded body 140 such that the top portion 131 of the at least one first bond wire loop 130 is exposed from its first side 141.

According to an example, a transfer molding process or a compression molding process is used to fabricate the molded body 140. After the molding process, the top portion 131 of the first bond wire loop(s) 130 may be covered by mold material, e.g. by a thin layer of mold material. A mold material removal process may be used to clean and expose the top portion(s) 131. This may e.g. comprise a chemical and/or mechanical deflashing of the top portion(s) 131 using e.g. a chemical softener and/or a water jet.

The molded body 140 may be configured to prevent corrosion of a metallization of the semiconductor die 120, it may be configured to act as ion catcher for high voltage operation and it may have better dielectric properties than a laminate does.

Figure 4E:
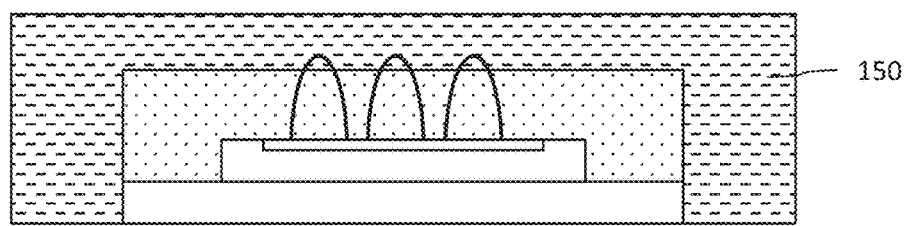

As shown in FIG. 4E, the laminate 150 is laminated over the molded body 140 such that it covers the top portion 131 of the at least one first bond wire loop 130. The lamination process may e.g. be performed after the molded body 130 has been cured.

Since the semiconductor die 120 is already encapsulated in the molded body 140, a risk that it is damaged by e.g. rough handling during the lamination process may be eliminated.

Figure 4F:
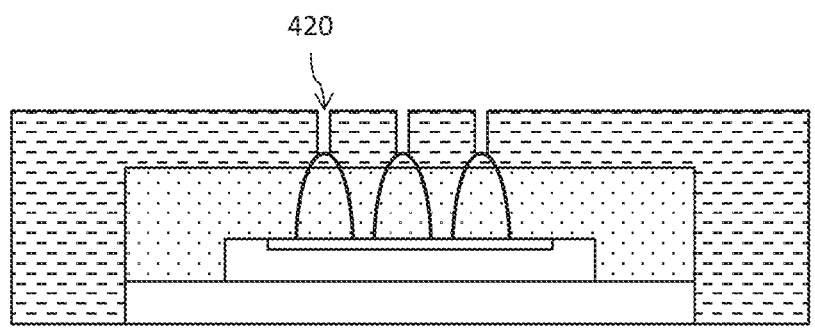

As shown in FIG. 4F, the top portion 131 of the at least one first bond wire loop 130 is exposed from the laminate 150 by drilling one or more holes 420 into the laminate 150. The hole(s) 420 may for example be drilled using a laser drilling process. The hole(s) 420 may e.g. be drilled after the laminate 150 has been cured.

Since the hole(s) 420 need only extend to the top portion 131 of the first bond wire loop(s) 130 and not down to the first electrode 121, there is no risk that the first electrode 121 is accidentally damaged due to drilling the hole(s) 420 too deep. Furthermore, no grinding has to be performed on the molded body 140 in order to fabricate an electrical contact to the first electrode 121 because the first bond wire loop(s) 130 are exposed from the molded body 140.

Figure 4G:
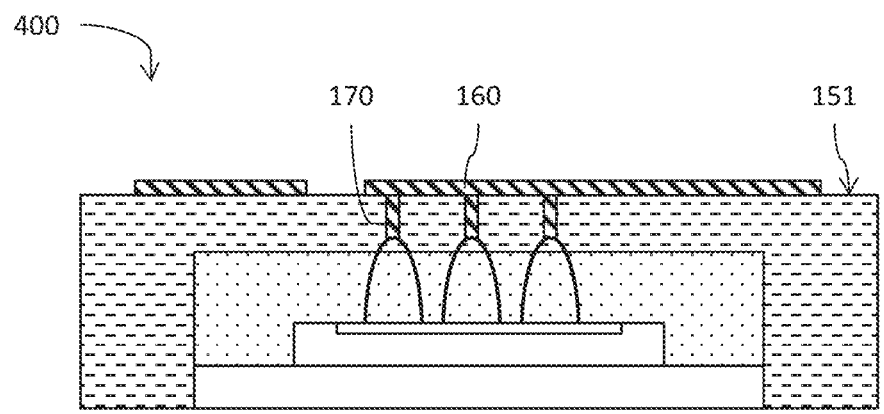

As shown in FIG. 4G, the vias 170 are fabricated in the holes 420 and the metallization layer 160 is fabricated on the first side 151 of the laminate such that the metallization layer 160 is coupled to the top portion 131 of the at least one first bond wire loop 130 by the at least one via 170.

Figure 5:
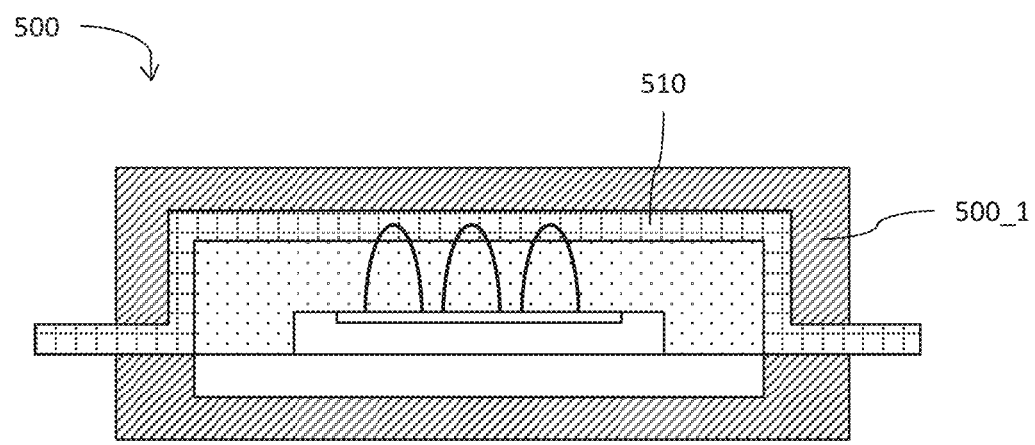
FIG. 5 shows a molding cavity configured for film assisted molding which may be used for fabricating a molded body from which a bond wire loop is exposed.

FIG. 5 shows the substrate 110 with the semiconductor die 120 and the at least one first bond wire loop 130 arranged in a molding cavity 500. The molding cavity 500 may be used for fabricating the molded body 140.

As shown in FIG. 5, the molding cavity 500 may be equipped for film assisted molding. In particular, the molding cavity 500 may be configured such that a film 510 covers the top portion 131 of the at least one first bond wire loop 130 (and possibly also the top portion 181 of the at least one second bond wire loop 180) and thereby prevent it from being covered by liquid mold material.

According to another example, no film assisted molding process is used. In this case, an upper part 500_1 of the molding cavity 500 itself may be configured to directly touch the top portions 131, 181 and completely or partially prevent them from being covered by liquid mold material. The top portions 131, 181 may become covered by a thin layer of mold material in this case, which can be removed by a deflashing process.

According to an example, the upper part 500_1 of the molding cavity 500 is configured to press down onto the top parts 131, 180 of the bond wire loops 130, 180. This downward pressure may help with compensating for height differences of individual bond wire loops due to fabrication tolerances and may ensure that all top portions 131, 181 are arranged coplanar with each other with a very high accuracy. Furthermore, pressing the bond wire loops 130, 180 into form like this may flatten the top portions 131, 181 which may e.g. facilitate contacting them with the vias 170. The flat top portions 131, 181 may be arranged in a plane parallel to the first side 141 of the molded body 140.

Figure 6:
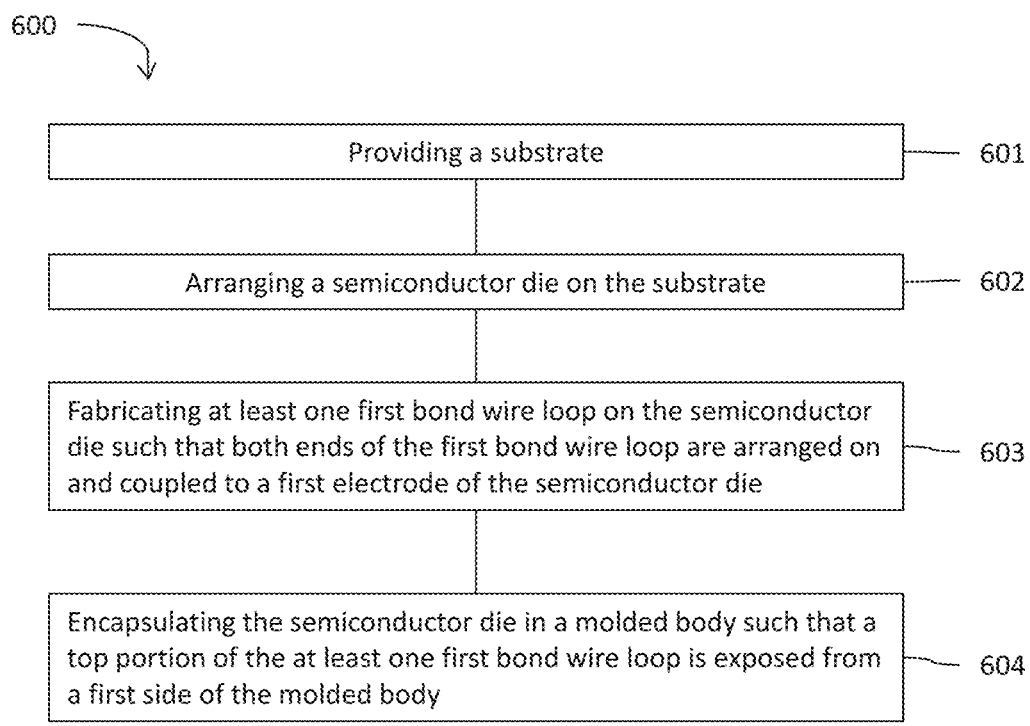
FIG. 6 is a flow chart of an exemplary method for fabricating semiconductor modules.

FIG. 6 is a flow chart of an exemplary method 600 for fabricating a semiconductor module. The method 600 may for example be used in the fabrication of the semiconductor modules 100, 200 and 400.

Method 600 comprises at 601 an act of providing a substrate, at 602 an act of arranging a semiconductor die on the substrate, at 603 an act of fabricating at least one first bond wire loop on the semiconductor die such that both ends of the first bond wire loop are arranged on and coupled to a first electrode of the semiconductor die, and at 604 an act of encapsulating the semiconductor die in a molded body such that a top portion of the at least one first bond wire loop is exposed from a first side of the molded body.

In the following the semiconductor module as well as the method for fabricating a semiconductor module is further explained using specific examples.

Example 1 is a semiconductor module, comprising: a substrate, a semiconductor die arranged on the substrate, at least one first bond wire loop, wherein both ends of the first bond wire loop are arranged on and coupled to a first electrode of the semiconductor die, and a molded body encapsulating the semiconductor die, wherein a top portion of the at least one first bond wire loop is exposed from a first side of the molded body.

Example 2 is the semiconductor module of example 1, wherein the at least one first bond wire loop is part of an array of bond wire loops arranged on and coupled to the first electrode.

Example 3 is the semiconductor module of example 1 or 2, further comprising: at least one second bond wire loop, wherein both ends of the second bond wire loop are arranged on and coupled to the substrate, and wherein a top portion of the at least one second bond wire loop is exposed from the first side of the molded body.

Example 4 is the semiconductor module of one of the preceding examples, wherein both ends of the at least one first bond wire loop are wedge bonded to the first electrode.

Example 5 is the semiconductor module of one of examples 1 to 3, wherein one end of the at least one first bond wire loop is ball bonded to the first electrode and the other end is wedge bonded to the first electrode.

Example 6 is the semiconductor module of one of the preceding examples, wherein the molded body comprises a content of filler particles of 70% or more.

Example 7 is the semiconductor module of one of the preceding examples, further comprising: a laminate at least partially encapsulating the molded body, and a metallization layer arranged on a first side of the laminate and coupled to the top portion of the at least one first bond wire loop by at least one via extending through the laminate.

Example 8 is the semiconductor module of example 7, wherein the laminate is part of a printed circuit board configured for having one or more electronic components arranged on and coupled to the metallization layer.

Example 9 is the semiconductor module of one of the preceding examples, wherein the substrate is a leadframe, a direct copper bond, a direct aluminum bond, an active metal brazing, a resistor, a capacitance, an inductor, or a further semiconductor die.

Example 10 is the semiconductor module of one of the preceding examples, wherein a loop height of the at least one first bond wire loop is 100 µm or more.

Example 11 is a method for fabricating a semiconductor module, the method comprising: providing a substrate, arranging a semiconductor die on the substrate, fabricating at least one first bond wire loop on the semiconductor die such that both ends of the first bond wire loop are arranged on and coupled to a first electrode of the semiconductor die, and encapsulating the semiconductor die in a molded body such that a top portion of the at least one first bond wire loop is exposed from a first side of the molded body.

Example 12 is the method of example 11, wherein the encapsulating comprises compression molding or transfer molding over the semiconductor die in a molding cavity, wherein the molding cavity is configured such that the top portion of the at least one first bond wire loop is not covered by mold compound.

Example 13 is the method of example 12, wherein film assisted molding is used to prevent the top portion of the at least one first bond wire loop from being covered by mold compound.

Example 14 is the method of one of examples 11 to 13, further comprising: laminating over the molded body such that the laminate covers the top portion of the at least one first bond wire loop, arranging a metallization layer on a first side of the laminate, and coupling the metallization layer to the top portion of the at least one first bond wire loop by at least one via extending through the laminate.

Example 15 is the method of example 14, wherein the coupling comprises exposing the top portion of the at least one first bond wire loop from the laminate by laser drilling and forming a via in the drilled hole.

Example 16 is an apparatus comprising means for performing the method according to anyone of examples 11 to 15.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor module, comprising:
   a substrate;
   a semiconductor die arranged on the substrate;
   at least one first bond wire loop, wherein both ends of the at least one first bond wire loop are arranged on and coupled to a first electrode of the semiconductor die;
   a molded body encapsulating the semiconductor die, wherein a top portion of the at least one first bond wire loop is exposed from a first side of the molded body;
   a laminate at least partially encapsulating the molded body, wherein the top portion of the at least one first bond wire loop extends into the laminate; and
   a metallization layer arranged on a first side of the laminate that faces away from the first side of the molded body,
   wherein the metallization layer is coupled to the top portion of the at least one first bond wire loop by at least one via,
   wherein the at least one via extends through only a part of a thickness of the laminate, from the first side of the laminate to the top portion of the at least one first bond wire loop.

2. The semiconductor module of claim 1, wherein the at least one first bond wire loop is part of an array of bond wire loops arranged on and coupled to the first electrode.

3. The semiconductor module of claim 1, further comprising:
   at least one second bond wire loop, wherein both ends of the at least one second bond wire loop are arranged on and coupled to the substrate,
   wherein a top portion of the at least one second bond wire loop is exposed from the first side of the molded body.

4. The semiconductor module of claim 1, wherein both ends of the at least one first bond wire loop are wedge bonded to the first electrode.

5. The semiconductor module of claim 1, wherein one end of the at least one first bond wire loop is ball bonded to the first electrode and the other end is wedge bonded to the first electrode.

6. The semiconductor module of claim 1, wherein the molded body comprises a content of filler particles of 70% or more.

7. The semiconductor module of claim 1, wherein the laminate is part of a printed circuit board configured for having one or more electronic components arranged on and coupled to the metallization layer.

8. The semiconductor module of claim 1, wherein the substrate is a leadframe, a direct copper bond, a direct aluminum bond, an active metal brazing, a resistor, a capacitance, an inductor, or a further semiconductor die.

9. The semiconductor module of claim 1, wherein a loop height of the at least one first bond wire loop is 100 µm or more.

10. A method for fabricating a semiconductor module, the method comprising:
    providing a substrate;
    arranging a semiconductor die on the substrate;
    fabricating at least one first bond wire loop on the semiconductor die such that both ends of the at least one first bond wire loop are arranged on and coupled to a first electrode of the semiconductor die;
    encapsulating the semiconductor die in a molded body such that a top portion of the at least one first bond wire loop is exposed from a first side of the molded body;
    forming a laminate that at least partially encapsulates the molded body, such that the top portion of the at least one first bond wire loop extends into the laminate;
    forming a metallization layer on a first side of the laminate that faces away from the first side of the molded body; and
    coupling the metallization layer to the top portion of the at least one first bond wire loop by at least one via,
    wherein the at least one via extends through only a part of a thickness of the laminate, from the first side of the laminate to the top portion of the at least one first bond wire loop.

11. The semiconductor module of claim 1, wherein the metallization layer is coupled to the top portion of the at least one second bond wire loop by at least one additional via, and wherein the at least one additional via extends through only a part of the thickness of the laminate, from the first side of the laminate to the top portion of the at least one second bond wire loop.

12. The method of claim 10, wherein the encapsulating comprises compression molding or transfer molding over the semiconductor die in a molding cavity, wherein the molding cavity is configured such that the top portion of the at least one first bond wire loop is not covered by mold compound.

13. The method of claim 12, wherein film assisted molding is used to prevent the top portion of the at least one first bond wire loop from being covered by mold compound.

14. The method of claim 10, wherein the coupling comprises:
    exposing the top portion of the at least one first bond wire loop from the laminate by a drilled hole formed by laser drilling; and
    forming a via in the drilled hole.

\* \* \* \* \*